(12) United States Patent
Mori et al.

(10) Patent No.: US 10,085,368 B2
(45) Date of Patent: Sep. 25, 2018

(54) ELECTRONIC DEVICE

(71) Applicant: KABUSHIKI KAISHA TOYOTA JIDOSHOKKI, Aichi-ken (JP)

(72) Inventors: Shogo Mori, Kariya (JP); Naoki Kato, Kariya (JP); Hiroshi Yuguchi, Kariya (JP); Yoshitaka Iwata, Kariya (JP); Masahiko Kawabe, Kariya (JP); Yuri Otobe, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 0 days.

(21) Appl. No.: 15/528,603

(22) PCT Filed: Nov. 6, 2015

(86) PCT No.: PCT/JP2015/081250
§ 371 (c)(1),
(2) Date: May 22, 2017

(87) PCT Pub. No.: WO2016/084579
PCT Pub. Date: Jun. 2, 2016

(65) Prior Publication Data
US 2017/0280595 A1    Sep. 28, 2017

(30) Foreign Application Priority Data
Nov. 27, 2014    (JP) .................................. 2014-240286

(51) Int. Cl.
*H05K 7/20* (2006.01)
*H01L 21/48* (2006.01)
(Continued)

(52) U.S. Cl.
CPC ..... *H05K 7/20927* (2013.01); *H01L 21/4846* (2013.01); *H01L 23/29* (2013.01);
(Continued)

(58) Field of Classification Search
CPC .. H05K 7/20436; H05K 7/20263; H05K 7/14; H02M 7/003; H02M 7/42; H01L 21/4846; H01L 2224/32221
(Continued)

(56) References Cited

U.S. PATENT DOCUMENTS

| 5,991,162 A | 11/1999 | Saso |
| 8,358,000 B2* | 1/2013 | Beaupre ............. H01L 23/3735 |
| | | 257/691 |

(Continued)

FOREIGN PATENT DOCUMENTS

| JP | 11-17349 | 1/1999 |
| JP | 2010-73767 | 4/2010 |

(Continued)

OTHER PUBLICATIONS

Translation of International Preliminary Report on Patentability for PCT/JP2015/081250 dated May 30, 2017.

(Continued)

*Primary Examiner* — Anatoly Vortman
(74) *Attorney, Agent, or Firm* — Greenblum & Bernstein, P.L.C.

(57) ABSTRACT

An electronic device includes a heat dissipation member, a power element that is thermally coupled to the heat dissipation member, and a first conductive layer to which the power element is electrically coupled. The electronic device further includes a control element that controls a switching operation of the power element, a second conductive layer to which the control element is electrically coupled, and a resin layer arranged between the first conductive layer and the second conductive layer. The power element is embedded in the resin layer. The first conductive layer, the resin (Continued)

layer, and the second conductive layer are stacked on the heat dissipation member in this order from the ones closer to the heat dissipation member.

6 Claims, 1 Drawing Sheet

(51) Int. Cl.
*H02M 7/42* (2006.01)
*H05K 7/14* (2006.01)
*H02M 7/00* (2006.01)
*H01L 23/29* (2006.01)
*H05K 1/18* (2006.01)
*H05K 3/46* (2006.01)
*H05K 1/02* (2006.01)
*H02M 1/32* (2007.01)

(52) U.S. Cl.
CPC ............ *H02M 7/003* (2013.01); *H02M 7/42* (2013.01); *H05K 1/021* (2013.01); *H05K 1/0207* (2013.01); *H05K 1/185* (2013.01); *H05K 3/4697* (2013.01); *H05K 7/14* (2013.01); *H05K 7/20263* (2013.01); *H05K 7/20436* (2013.01); *H01L 2224/32221* (2013.01); *H01L 2924/0002* (2013.01); *H02M 2001/327* (2013.01); *H05K 1/0204* (2013.01); *H05K 2201/1003* (2013.01); *H05K 2201/10166* (2013.01)

(58) Field of Classification Search
USPC ........................................................ 361/704
See application file for complete search history.

(56) References Cited

U.S. PATENT DOCUMENTS

| | | | |
|---|---|---|---|
| 8,415,565 | B2 | 4/2013 | Nagase et al. |
| 9,209,151 | B2* | 12/2015 | Chauhan .................. H01L 24/26 |
| 2003/0128521 | A1* | 7/2003 | Matayabas, Jr. .... H01L 23/3737 361/705 |
| 2004/0118551 | A1* | 6/2004 | Czubarow ........... H01L 23/3735 165/80.3 |
| 2009/0189291 | A1 | 7/2009 | Landau et al. |
| 2010/0065307 | A1 | 3/2010 | Nagase et al. |
| 2011/0042812 | A1* | 2/2011 | Kayukawa .............. H01L 21/56 257/741 |
| 2011/0204505 | A1 | 8/2011 | Pagaila et al. |
| 2013/0009325 | A1* | 1/2013 | Mori ................... H01L 23/5389 257/774 |

FOREIGN PATENT DOCUMENTS

| | | |
|---|---|---|
| JP | 2010-109309 | 5/2010 |
| JP | 2011-44452 | 3/2011 |
| JP | 2016-103538 | 6/2016 |

OTHER PUBLICATIONS

Translation of Written Opinion of International Search Authority for PCT/ JP2015/081250 dated Jan. 26, 2016.
International Search Report for International Patent Application No. PCT/JP2015/081250, dated Jan. 26, 2016, along with English-language translation thereof.

* cited by examiner

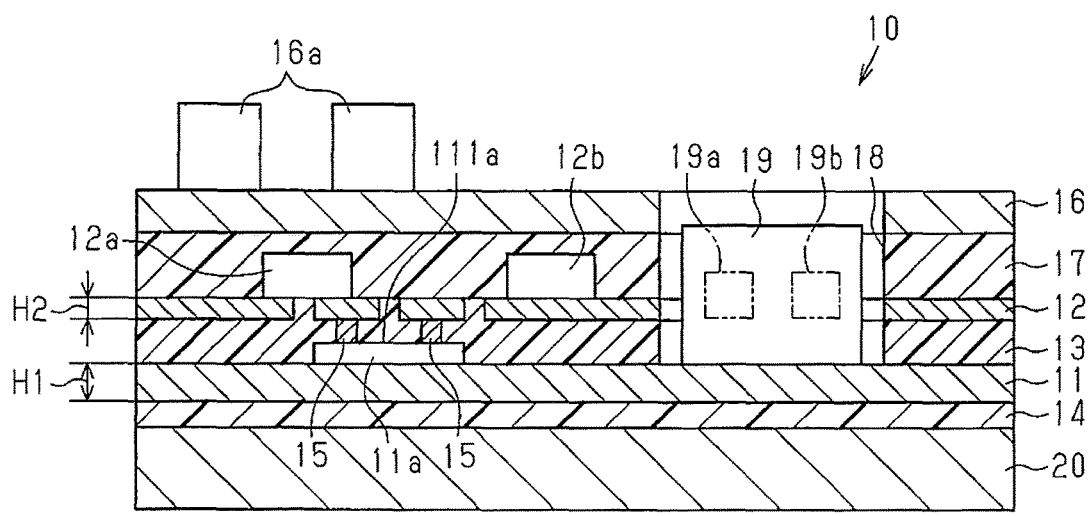

ELECTRONIC DEVICE

TECHNICAL FIELD

The present invention relates to an electronic device.

BACKGROUND ART

Patent document 1 discloses a typical inverter device that is installed in a vehicle. The inverter device is an electronic device that converts direct current voltage into alternating current voltage. The inverter device includes a first metal plate (first conductive layer), on which a power element is mounted, and a second metal plate (second conductive layer), on which a control element is mounted. The control element controls a switching operation of the power element.

PRIOR ART DOCUMENT

Patent Document

Patent Document 1: Japanese Laid-Open Patent Publication No. 2010-73767

SUMMARY OF THE INVENTION

Problems That are to be Solved by the Invention

The power element generates a greater amount of heat than the control element. Thus, it is desired that the power element be efficiently cooled. Further, in such an electronic device, for example, when the first metal plate and the second metal plate are arranged next to each other on the same plane, the planar size of the electronic device increases. In such a case, the limited available space in the vehicle makes it difficult for the electronic device to be installed in the vehicle.

It is an object of the present invention to provide an electronic device that efficiently cools a power element and reduces the planar size of the electronic device.

Means for Solving the Problem

An electronic device that solves the above problem includes a heat dissipation member, a power element that is thermally coupled to the heat dissipation member, a first conductive layer to which the power element is electrically coupled, a control element that controls a switching operation of the power element, a second conductive layer to which the control element is electrically coupled, and a resin layer arranged between the first conductive layer and the second conductive layer. The power element is embedded in the resin layer. The first conductive layer, the resin layer, and the second conductive layer are stacked on the heat dissipation member in this order from the ones closer to the heat dissipation member.

BRIEF DESCRIPTION OF THE DRAWINGS

FIG. 1 is a cross-sectional view showing one embodiment of an electronic device.

EMBODIMENTS OF THE INVENTION

One embodiment of an electronic device 10 will now be described with reference to FIG. 1. The electronic device 10 of the present embodiment is, for example, an in-vehicle inverter device.

As shown in FIG. 1, the electronic device 10 includes a heat dissipation member 20, a power element 11a, a first metal plate 11 serving as a first conductive layer, two control elements 12a and 12b, and a second metal plate 12 serving as a second conductive layer. The power element 11a is electrically coupled to the first metal plate 11, and the control elements 12a and 12b are electrically coupled to the second metal plate 12. The power element 11a is a metal-oxide-semiconductor field-effect transistor (MOSFET) and bare chip-mounted on the first metal plate 11. Each of the control elements 12a and 12b is, for example, a chip resistor or a capacitor. The heat dissipation member 20 is, for example, an aluminum housing including a coolant passage through which coolant flows. The first metal plate 11 and the second metal plate 12 are flat copper plates. The thickness H1 of the first metal plate 11 is greater than the thickness H2 of the second metal plate 12. Thus, a larger current flows to the first metal plate 11 than the second metal plate 12.

The electronic device 10 includes a resin layer 13 located between the first metal plate 11 and the second metal plate 12. The power element 11a is embedded in the resin layer 13. The resin layer 13 is formed from an epoxy resin including fillers that have a good thermal conductivity such as glass fiber. The first metal plate 11, the resin layer 13, and the second metal plate 12 are stacked on the heat dissipation member 20 in this order from the ones closer to the heat dissipation member 20. Thus, the first metal plate 11 is located closer to the heat dissipation member 20 than the second metal plate 12. The power element 11a partially overlaps one of the control elements 12a in the direction in which the first metal plate 11, the resin layer 13, and the second metal plate 12 are stacked (hereinafter referred to as "stacking direction"). The power element 11a is arranged between the first metal plate 11 and the resin layer 13 and embedded in the resin layer 13.

A high thermal conduction insulative layer 14 is arranged between the heat dissipation member 20 and the first metal plate 11. The high thermal conduction insulative layer 14 is formed from an epoxy resin including fillers having a good thermal conductivity such as glass fiber. The amount of the fillers mixed with the epoxy resin that forms the high thermal conduction insulative layer 14 is greater than the amount of the fillers mixed in the epoxy resin that forms the resin layer 13. Thus, the high thermal conduction insulative layer 14 has a higher thermal conductivity than the resin layer 13.

The power element 11a is electrically connected to the second metal plate 12 by two plate-shaped conductive members 15. Each flat conductive member 15 extends through the resin layer 13 in a vertical direction to a plane 111a of the power element 11a that opposes the second metal plate 12. Thus, each conductive member 15 is arranged so that a thickness-wise direction of each conductive member 15 corresponds to a direction extending along the plane 111a of the power element 11a. The conductive members 15 form a path for the current flowing between the power element 11a and the control elements 12a and 12b. A switching operation of the power element 11a is performed when current flows between the control elements 12a and 12b and the power element 11a through the second metal plate 12 and the conductive members 15. Thus, the control elements 12a and 12b control the switching operation of the power element 11a.

The electronic device 10 includes a third metal plate 16 having heat generating elements 16a that generate a smaller amount of heat than the control elements 12a and 12b. The third metal plate 16 is a flat copper plate. The third metal plate 16 and the first metal plate 11 are located at opposite sides of the second metal plate 12. An insulative layer 17 is arranged between the second metal plate 12 and the third metal plate 16. That is, the third metal plate 16 is arranged on the insulative layer 17. The insulative layer 17 is formed from an epoxy resin including fillers having a good thermal conductivity such as glass fiber. The thermal conductivity of the resin layer 13 is equal to that of the insulative layer 17. The control elements 12a and 12b are located between the second metal plate 12 and the insulative layer 17 and embedded in the insulative layer 17.

The electronic device 10 includes a through hole 18 extending in the stacking direction through the third metal plate 16, the insulative layer 17, the second metal plate 12, and the resin layer 13. The through hole 18 accommodates an induction device 19 (for example, reactor) that is mounted on the first metal plate 11. The induction device 19 includes a coil 19a (shown by broken line in FIG. 1) that is electrically coupled to the first metal plate 11 and a core 19b (shown by broken line in FIG. 1) that is thermally coupled to the first metal plate 11. The induction device 19 does not extend beyond an upper surface of the third metal plate 16 (surface of third metal plate 16 located at side opposite to insulative layer 17).

The operation of the present embodiment will now be described.

The power element 11a generates a greater amount of heat than the control elements 12a and 12b. The first metal plate 11 is located closer to the heat dissipation member 20 than the second metal plate 12. Thus, the heat dissipation member 20 gives priority to the dissipation of the heat generated from the power element 11a over the dissipation of the heat generated from the control elements 12a and 12b. Further, the high thermal conduction insulative layer 14 has a higher thermal conductivity than the resin layer 13. Thus, the heat generated from the power element 11a is transmitted more easily to the high thermal conduction insulative layer 14 than the resin layer 13. As a result, the heat generated from the power element 11a is transmitted through the first metal plate 11 and the high thermal conduction insulative layer 14 to the heat dissipation member 20 and dissipated from the heat dissipation member 20. Further, the heat generated from the coil 19a and the core 19b of the induction device 19 is transmitted through the first metal plate 11 and the high thermal conduction insulative layer 14 to the heat dissipation member 20 and dissipated from the heat dissipation member 20.

The above embodiment has the advantages described below.

(1) The first metal plate 11, the resin layer 13, and the second metal plate 12 are stacked on the heat dissipation member 20 in this order from the ones closer to the heat dissipation member 20. The first metal plate 11 is located closer to the heat dissipation member 20 than the second metal plate 12. Thus, the heat dissipation member 20 gives priority to the dissipation of the heat generated from the power element 11a over the dissipation of the heat generated from the control elements 12a and 12b. Further, the first metal plate 11, the resin layer 13, and the second metal plate 12 are stacked on the heat dissipation member 20. Thus, the power element 11a is cooled more efficiently and the planar size of the electronic device 10 is reduced as compared to when the first metal plate 11 and the second metal plate 12 are arranged next to each other on the same plane.

(2) The high thermal conduction insulative layer 14 having a higher thermal conductivity than the resin layer 13 is located between the heat dissipation member 20 and the first metal plate 11. Thus, even in a structure in which the heat dissipation member 20 needs to be insulated from the first metal plate 11, the high thermal conduction insulative layer 14 located between the heat dissipation member 20 and the first metal plate 11 has a higher thermal conductivity than the resin layer 13. Accordingly, the heat transmitted from the power element 11a is transmitted to the high thermal conduction insulative layer 14 more easily than the resin layer 13. The heat transmitted to the high thermal conduction insulative layer 14 is further transmitted to the heat dissipation member 20 and dissipated from the heat dissipation member 20. Thus, even in a structure in which the heat dissipation member 20 needs to be insulated from the first metal plate 11, the power element 11a can be efficiently cooled.

(3) The power element 11a is connected to the second metal plate 12 by the conductive members 15. The conductive members 15 extend through the resin layer 13 in the vertical direction to the plane of the power element 11a that opposes the second metal plate 12. This reduces the planar size of the electronic device 10 as compared to when arranging the power element 11a and the second metal plate 12 next to each other on the same plane and connecting the power element 11a and the second metal plate 12 through wire bonding.

(4) The conductive members 15 are plate-shaped. Thus, as compared to when the power element 11a is electrically connected to the second metal plate 12 by a through hole, the power element 11a and the second metal plate 12 are electrically connected in a further favorable manner.

(5) The power element 11a overlaps the control element 12a in the stacking direction. This reduces the planar size of the electronic device 10 as compared to when the power element 11a does not overlap the control element 12a in the stacking direction.

(6) The coil 19a is electrically coupled to the first metal plate 11, and the core 19b is thermally coupled to the first metal plate 11. Thus, the heat generated from the coil 19a and the core 19b is transmitted through the first metal plate 11 and the high thermal conduction insulative layer 14 to the heat dissipation member 20 and dissipated from the heat dissipation member 20. This allows for effective cooling of the coil 19a and the core 19b that generate a large amount of heat.

(7) The power element 11a is a MOSFET and bare-chip mounted on the first metal plate 11. This reduces the size of the electronic device 10 as compared to when a packaged power element is mounted on the first metal plate 11.

(8) The thickness H1 of the first metal plate 11 is greater than the thickness H2 of the second metal plate 12. This reduces the size of the electronic device 10 in a plan view as compared to when the planar size of the first metal plate 11 is increased.

(9) The induction device 19 is accommodated in the through hole 18 and does not extend beyond the upper surface of the third metal plate 16. This reduces the size of the electronic device 10 as compared to when the induction device 19 extends beyond the upper surface of the third metal plate 16.

(10) The heat generated from the power element 11a is transmitted through the first metal plate 11 and the high thermal conduction insulative layer 14 to the heat dissipation member 20 and dissipated from the heat dissipation member 20. This limits situations in which the heat generated from the power element 11a is transmitted through the conductive members 15 and the second metal plate 12 to the control elements 12a and 12b.

The above embodiment may be modified as described below.

In the embodiment, the power element 11a does not have to overlap the control element 12a in the stacking direction.

In the embodiment, the shape of the conductive member 15 is not particularly limited. For example, the conductive member 15 may be pin-shaped.

In the embodiment, the power element 11a may be electrically connected to the second metal plate 12 by a through hole.

In the embodiment, an insulative layer having the same thermal conductivity as the resin layer 13 may be arranged between the heat dissipation member 20 and the first metal plate 11.

In the embodiment, the high thermal conduction insulative layer 14 may be formed from a ceramic.

In the embodiment, as long as the heat dissipation member 20 does not have to be insulated from the first metal plate 11, the high thermal conduction insulative layer 14 may be omitted. Further, the first metal plate 11 may be bonded to the heat dissipation member 20.

In the embodiment, the numbers of the power element 11a and the control elements 12a and 12b are not particularly limited.

In the embodiment, the thickness H1 of the first metal plate 11 may be equal to the thickness H2 of the second metal plate 12.

In the embodiment, a metal plate may be arranged between the high thermal conduction insulative layer 14 and the heat dissipation member 20.

In the embodiment, an additional metal plate may be arranged between the third metal plate 16 and the insulative layer 17. In this case, an insulative layer that insulates the third metal plate 16 from the additional metal plate needs to be added.

In the embodiment, the heat dissipation member 20 may be, for example, a housing into which air flows to perform cooling.

In the embodiment, the electronic device 10 does not have to be an in-vehicle device. In addition, the present invention is not limited to the inverter device and may be applied to a DC-DC converter device.

What is claimed is:

1. An electronic device comprising:
   a heat dissipation member;
   a power element that is thermally coupled to the heat dissipation member;
   a first conductive layer to which the power element is electrically coupled;
   a control element that controls a switching operation of the power element;
   a second conductive layer to which the control element is electrically coupled; and
   a resin layer arranged between the first conductive layer and the second conductive layer, wherein the power element is embedded in the resin layer, wherein
   the first conductive layer, the resin layer, and the second conductive layer are stacked on the heat dissipation member in this order from the ones closer to the heat dissipation member,
   the resin layer and the second conductive layer include a through hole,
   the through hole accommodates a coil and a core, and
   the coil is electrically coupled to the first conductive layer and the core is thermally coupled to the first conductive layer.

2. The electronic device according to claim 1, wherein the power element is a MOSFET, and
   the power element is bare-chip mounted on the first conductive layer.

3. The electronic device according to claim 1, wherein the first conductive layer has a thickness that is greater than that of the second conductive layer.

4. The electronic device according to claim 1, further comprising
   conductive members that extend through the resin layer in a vertical direction to a plane of the power element opposing the second conductive layer in order to connect the power element to the second conductive layer.

5. The electronic device according to claim 4, wherein the conductive members are plate-shaped.

6. The electronic device according to claim 1, wherein the power element overlaps the control element in a stacking direction in which the first conductive layer, the resin layer, and the second conductive layer are stacked.

* * * * *